(12) United States Patent
Riley et al.

(10) Patent No.: US 10,332,609 B1
(45) Date of Patent: Jun. 25, 2019

(54) SYSTEMS AND METHODS FOR IMPROVING FUSE SYSTEMS IN MEMORY DEVICES

(71) Applicant: Micron Technology, Inc., Boise, ID (US)

(72) Inventors: John E. Riley, McKinney, TX (US); Yu-Feng Chen, Plano, TX (US); Scott E. Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/851,129

(22) Filed: Dec. 21, 2017

(51) Int. Cl.
| | | |
|---|---|---|
| *G11C 17/16* | (2006.01) | |
| *G11C 17/18* | (2006.01) | |
| *G11C 7/22* | (2006.01) | |
| *G11C 29/00* | (2006.01) | |
| *G11C 7/10* | (2006.01) | |
| *G11C 29/04* | (2006.01) | |

(52) U.S. Cl.
CPC ............ *G11C 17/16* (2013.01); *G11C 7/1006* (2013.01); *G11C 7/22* (2013.01); *G11C 17/18* (2013.01); *G11C 29/04* (2013.01); *G11C 29/812* (2013.01)

(58) Field of Classification Search
CPC ....... G11C 17/16; G11C 29/04; G11C 7/1006; G11C 7/22; G11C 17/18; G11C 29/812; G11C 7/10; G11C 8/00
See application file for complete search history.

(56) References Cited

U.S. PATENT DOCUMENTS

| | | | | |
|---|---|---|---|---|
| 6,922,649 | B2 * | 7/2005 | Mondal | G11C 29/44 365/225.7 |
| 7,362,160 | B2 * | 4/2008 | Sugimura | G11C 17/165 327/525 |
| 2013/0322183 | A1 * | 12/2013 | Jeong | G11C 8/00 365/189.05 |
| 2015/0179237 | A1 * | 6/2015 | Jeong | G11C 7/106 365/154 |

* cited by examiner

*Primary Examiner* — David Lam
(74) *Attorney, Agent, or Firm* — Fletcher Yoder, P.C.

(57) ABSTRACT

A memory device includes a memory bank accessible via a plurality of memory addresses. The memory device further includes a fuse array comprising a plurality of fuses. The memory device additionally includes a first plurality of local fuse latches disposed outside of the fuse array and configured to provide redundancy for the plurality of memory addresses. The memory device also includes a fuse array broadcasting system comprising an N-bit bus system, wherein the N-bit bus system is communicatively coupled to the fuse array and to the first plurality of local fuse latches, and wherein the fuse array broadcasting system is configured to communicate fuse data from the fuse array to the first plurality of local fuse latches via the N-bit bus system.

19 Claims, 5 Drawing Sheets

SYSTEMS AND METHODS FOR IMPROVING FUSE SYSTEMS IN MEMORY DEVICES

BACKGROUND

Field of the Present Disclosure

The present disclosure relates to circuitry for memory devices, and more specifically, to systems and methods for improving fuse array systems in memory devices.

Description of Related Art

Random access memory (RAM) devices, such as the ones that may be employed in electrical devices to provide data processing and/or storage, may provide direct availability to addressable data stored in memory circuitry of the device. Certain RAM devices, such as synchronous dynamic RAM (SDRAM) devices may, for example, have multiple memory banks having many addressable memory elements. Certain of the SDRAM may include fuse systems suitable for "repairing" certain of the memory elements as well as for adding new functions even after the SDRAM device is manufactured and is in use. For example, in certain SDRAM devices, a fuse array may be used to group a plurality of fuses. By grouping one or more fuses into the fuse array, die size and variability may be reduced. It may be useful to improve systems and methods that incorporate fuse arrays.

Embodiments of the present disclosure may be directed to one or more of the problems set forth above.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical devices may include random access memory (RAM) memory devices coupled to processing circuitry, and the memory devices may provide storage for data processing. Examples of RAM devices include dynamic RAM (DRAM) devices and synchronous DRAM (SDRAM) devices, which may store individual bits electronically. The stored bits may be organized into addressable memory elements (e.g., words), which may be stored in memory banks. To receive and to transmit the bits, the RAM devices may include certain data communications circuitry as well as communication lines useful in saving and retrieving the bits from the memory bank. In certain DRAM and SDRAM devices, fuse circuitry may be used to provide redundant address operations and to control optional circuit features (e.g., trim certain circuitry).

For example, redundant memory may be provided so that a memory address pointing to an inoperative memory cell may be changed to point to a redundant memory cell via a programmable fuse. In certain embodiments, a fuse circuit may be programmed to substitute a first memory cell address (e.g., pointing to a memory cell that is in an inoperative condition) with a second memory cell address (e.g., pointing to the redundant memory cell), when access to the first address is requested. The programming of the address may include electrical operations and laser operations. For example, a target fuse may be cut to "program" the address by application of an over-current to the target fuse. Likewise, a second target fuse may be cut through application of a laser beam. It is also noted that as used herein the term "fuse" may refer to circuitry which may be cut or blown, for example, to increase the resistance of the circuitry, as well as circuitry (e.g., sometimes referred to as antifuse circuitry) that may include techniques to "grow" conductive paths or otherwise increase the conductivity of a path to reduce the resistance of the circuitry. That is, a "fuse" when activated may be physically changed to increase resistance or to lower resistance, to increase or lower capacitance, and so on, depending on the fuse type.

Fuses may additionally or alternatively be used to control certain optional features, e.g., by enabling and/or disabling certain circuitry after manufacturing, such as trimming of voltage regulator circuitry, providing for analog level changes, providing for timing changes, and so on. Fuses may be disposed in fuse arrays in order to minimize die space, for example, and to minimize or eliminate variation during manufacturing of the fuses. Fuse circuitry may additionally include compare circuitry, sense circuitry, latches, and so on, to program and/or use the fuse, as further described below. The techniques described herein provide for a fuse array broadcasting system that may use an N-bit bus to broadcast fuse array data to local fuse latches.

The local fuse latches may be disposed outside of the fuse array die area, and in some embodiments, anywhere in the die as long as they are communicatively coupled to the N-bit bus. Indeed, fuse array data (e.g., row of the fuse, column of fuse, and/or option for the fuse) may be broadcast through the N-bit bus and receiving local latches may use the fuse array data to program local behavior (e.g., fuse behavior). In some embodiments, the fuse array data may be temporary data that may be broadcast to the local latches without having to cut the fuses. Indeed, the temporary data may be used, for example, in a test mode, to verify and/or validate a design before actually burning the design into the memory device. By providing for N-bit bus-based broadcasts to local latches, the techniques described herein may enable faster and more flexible transmission and usage of fuse arrays.

Figure 1:
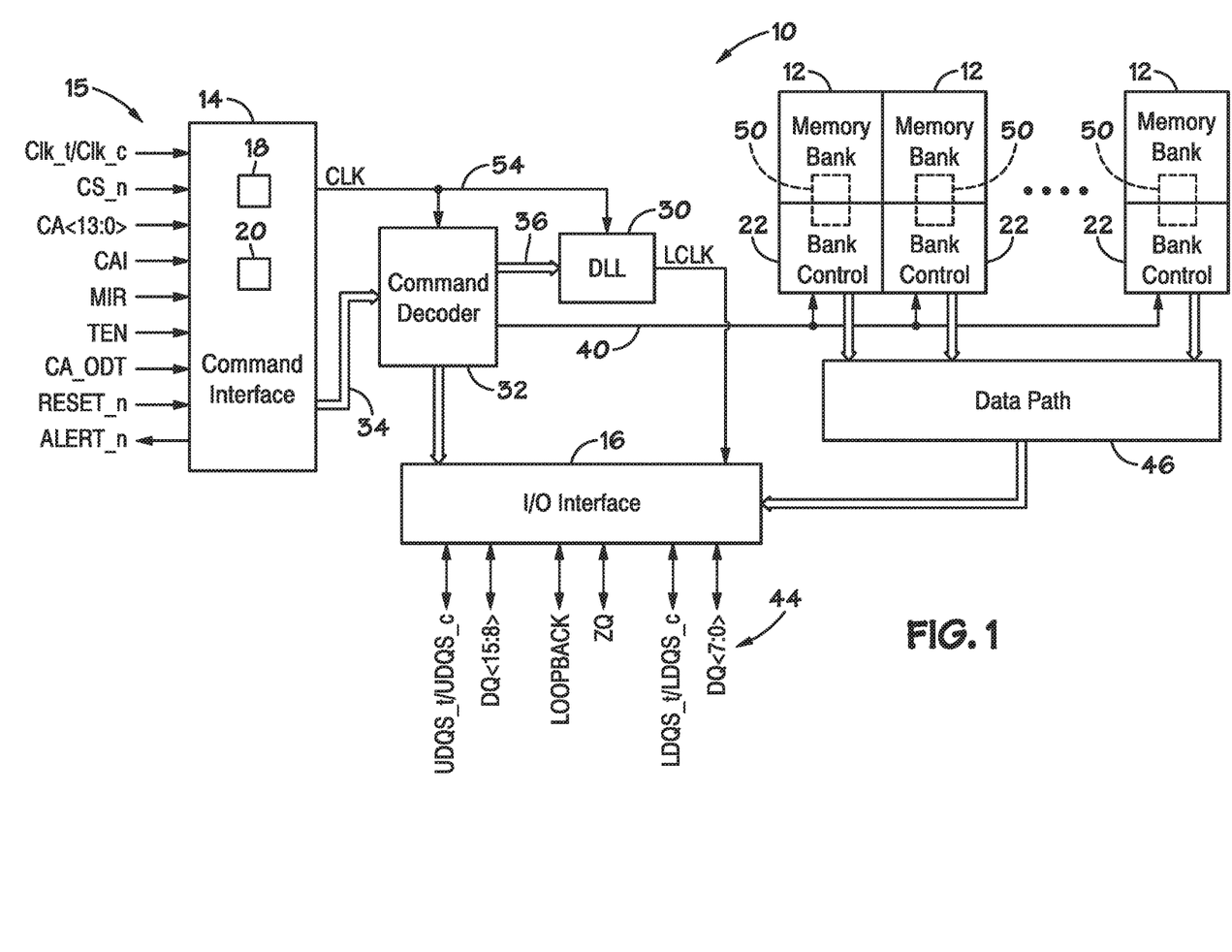
FIG. 1 is a block diagram illustrating an organization of a memory device that may include a fuse array broadcasting system, in accordance with an embodiment.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM as further described herein allow for reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command (WrCmd), etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data for read and write commands may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

The data (e.g., IO signals) for read and writes may be addressed to certain memory (e.g., memory cells) in the memory banks 12. The techniques described herein provide for a fuse array broadcasting system 50 that may broadcast fuse array data via an N-bit bus to local latches. The N-bit bus may provide for higher bandwidth of data transmittal, for example N times the bandwidth when compared to a single-bit serial bus. The N-bit bus may also enable the disposition of fuse latches anywhere on a die. Further, the N-bit bus may be used for other communicative purposes when not in use broadcasting fuse data. In some embodiments, the broadcast may include test data, which may be manually entered. That is, rather than transmitting data after activing (e.g., cutting or burning) one or more fuses, test data may be transmitted to the local latches to verify and/or validate certain behaviors and/or circuitry without physically changing the fuse. The fuse array broadcasting system 50 may be disposed in the bank control 22, the memory bank 12, or a combination thereof. Accordingly, the fuse array broadcasting system 50 may provide for enhanced data transmission speeds and flexibility when using fuse arrays, as further described below with respect to FIGS. 2-5.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description. For example, the fuse array broadcasting system 50 or certain circuitry of the broadcasting system 50 may be disposed as part of one bank control 22 or all bank controls 22, as part of one memory bank 12 or all memory banks 12, or combinations thereof.

Figure 2A:
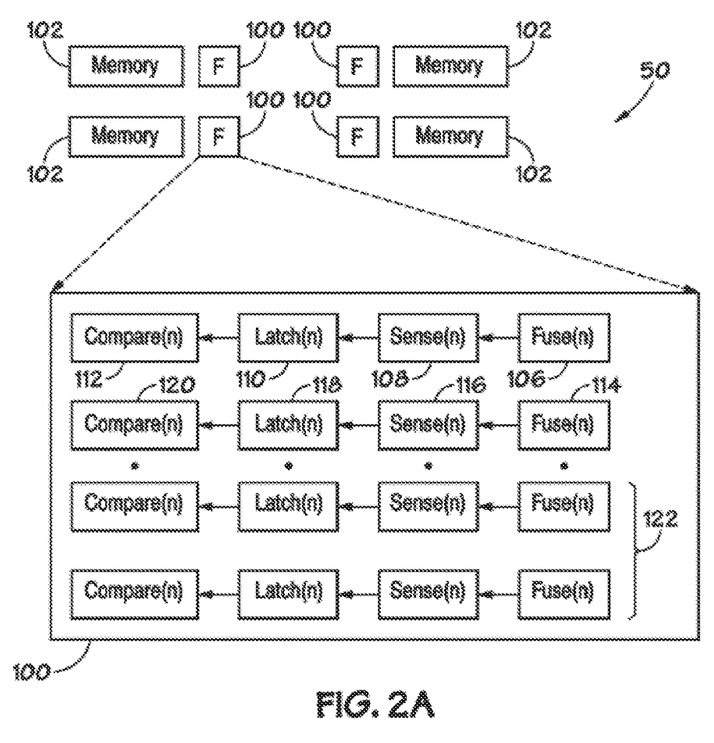
FIG. 2A is block diagram illustrating a discrete fuse array system without broadcasting, in accordance with an embodiment.
Figure 2B:
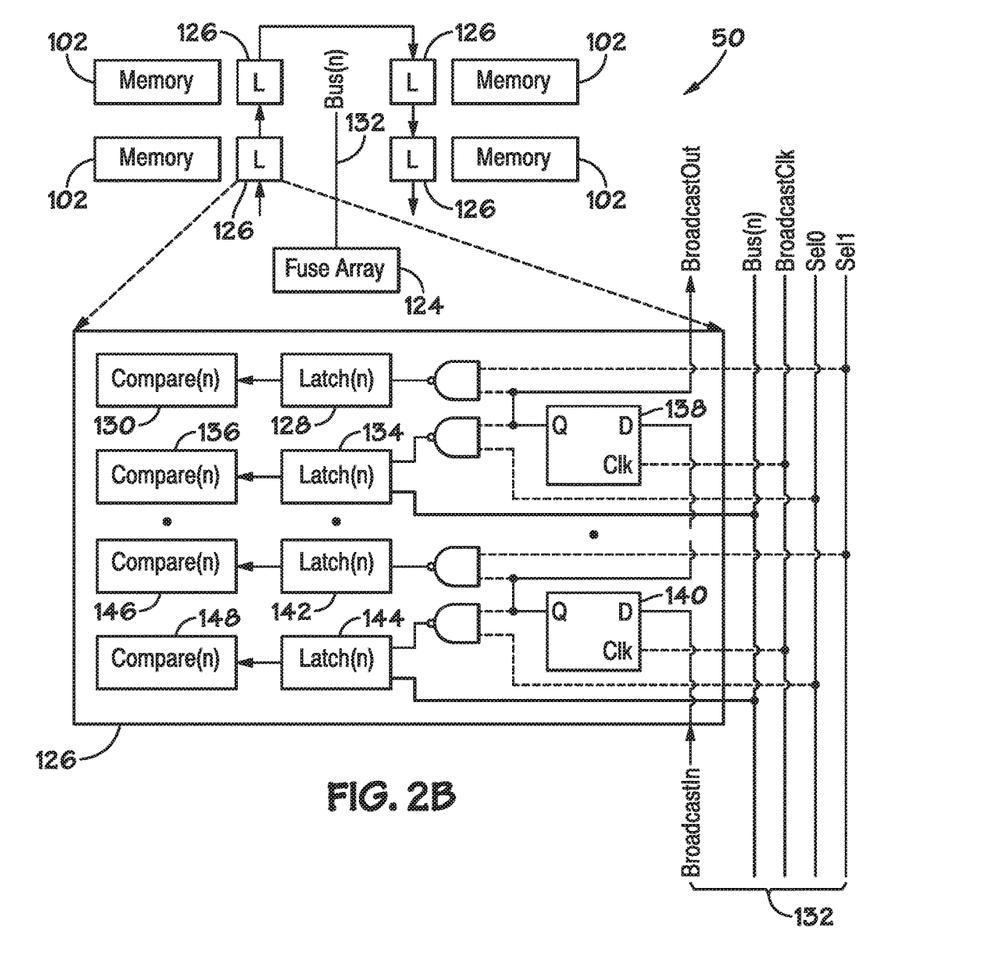
FIG. 2B t is block diagram illustrating the fuse array broadcasting system of FIG. 1, in accordance with an embodiment.

It would be beneficial to illustrate a side-by-side comparison of an embodiment of the fuse array broadcasting system 50 with a discrete fuse system. Accordingly, FIG. 2A depicts an embodiment of a discrete fuse system 100 while FIG. 2B depicts an embodiment of the fuse array broadcasting system 50 for comparison purposes. In the depicted embodiment in FIG. 2A, the discrete fuse system 100 may correspond to one or more memories 102 having row and/or column memory elements or cells. The discrete fuse system 100 may be designed to provide for row and/or column programming, including redundant programming of memory addresses corresponding to memories 102. For example, once a fuse 106 is activated (e.g., physically changed to be made substantially nonconductive or to be made substantially conductive depending on fuse type), sense circuitry 108 may sense certain fuse 106 data or properties, such as electrical resistance in ohms, capacitance in farads, and so on. Sensed data (e.g., property or properties) of the fuse 106 may then be stored via latch circuitry 110. For example, during initialization of the memory device 10, the sense circuitry 108 may sense a resistance value for the activated (e.g., blown) fuse 106 once the memory device is powered on, and the latch circuitry 110 may store the resistance value for use during subsequent memory device 10 operations.

In the depicted embodiment, compare circuitry 112 may then compare the value(s) stored in the latch circuitry 110 with, for example, a memory address (row and/or column address) value to determine if the fuse circuitry 106 is suitable for use or if a redundant fuse 114 should be used instead. That is, if the activation of the fuse 106 does not result in a desired value (e.g., resistance, capacitance), the fuse 114 may then be activated to provide for the desired value. The fuse 114 may be sensed via sense circuitry 116 to derive one or more fuse 114 properties (e.g., electrical resistance, capacitance) and the sensed properties may be stored via latch circuitry 118. Likewise, compare circuitry 120 may be used to compare the stored value(s) to determine if the fuse 114 is to be used operationally. Discrete fuse circuitry 122 may also provide for redundant and/or optional fuse operations for other memory (e.g., memory elements)

in the memory array 102. While the discrete fuse system 100 may provide for redundant operations as well as for optional functionality (e.g., trimming of circuitry) of the memory device 10, the discrete fuse system 100 may be supplanted or enhanced by the fuse array broadcasting system 50.

As illustrated in FIG. 2B, the fuse array broadcasting system 50 includes a fuse array system 124. The fuse array system 124 may include rows and/or columns of fuse circuitry, sensing circuitry, and so on, disposed in close proximity with each other. For example, fuses such as the fuses 106, 114, 122 and/or sense circuitry 108, 116 may be disposed in the fuse array 124. By disposing the fuses, such as the fuses 106, 114, 122, and the sense circuitry, such as the sense circuitry 108, 166, inside die space defining the fuse array 124, die usage space may be minimized and uniformity of fuses may be improved.

In the depicted embodiment, local fuse circuitry 126 may include latch circuitry 128 and compare circuitry 130. Latch circuitry 128 may be the same or similar to latch circuitry 110, 118, and compare circuitry 130 may be the same or similar to compare circuitry 112, 120. However, unlike in the discrete fuse system 100, the local latch circuitry 128 may not include fuse circuitry (e.g., circuitry 106, 114) and/or sense circuitry (e.g., circuitry 108, 116). Instead, the fuse circuitry and/or the sense circuitry may be included in the fuse array 124. Status of the fuse circuitry in the fuse array 124, such as sensed values (e.g., resistance, capacitance) for fuses in the fuse array 124 may be communicated via an N-bit bus system 132. The N-bit bus system 132 may use, for example, token passing to broadcast state information (e.g., sensed values) for a given fuse and the corresponding local latch or latches (e.g., latches 128, 134) may receive the state information from the fuse array 124 and then store the state information. Subsequently, compare circuitry for the local latches (e.g., compare circuitry 130, 136 corresponding to the latches 128, 134) may compare the stored status information to determine which, if any of the fuses in the fuse array 124, should be used for memory address operations of the memories 102.

In the depicted embodiment, data from the N-bit bus system 132 may first be processed via D-type flip-flops 138, 140, as further described below, to aid in selecting which of the latches (e.g., latches 128, 134 or latches 142, 144) to receive N-bit bus system 132 communications. Once the latches (e.g., latches 128, 134 or latches 142, 144) receive the communications from the N-bit bus system 132, then other circuitry, such as compare circuitry 130, 136, 146, 148 may be used to further process the communications, as describe earlier. That is, the fuse array broadcasting system 50 may broadcast data, such as fuse array 124 data, via an N-bit bus system, such as bus system 132, to multiple local latches (e.g., latches disposed in local latch circuitry 128). The local latches may then store the fuse array 124 data and subsequently, the stored latch data may be used for redundant memory operations and/or optional operations of the memory device 10. When fuse array 124 data is not being broadcast, the N-bit bus system 132 may be used for other data communication purposes. By broadcasting fuse array 124 data via the N-bit bus system, faster transmission may be achieved and local latch circuitry, such as latch circuitry 128, may be disposed anywhere on the die hosting the memory device 10.

Figure 3:
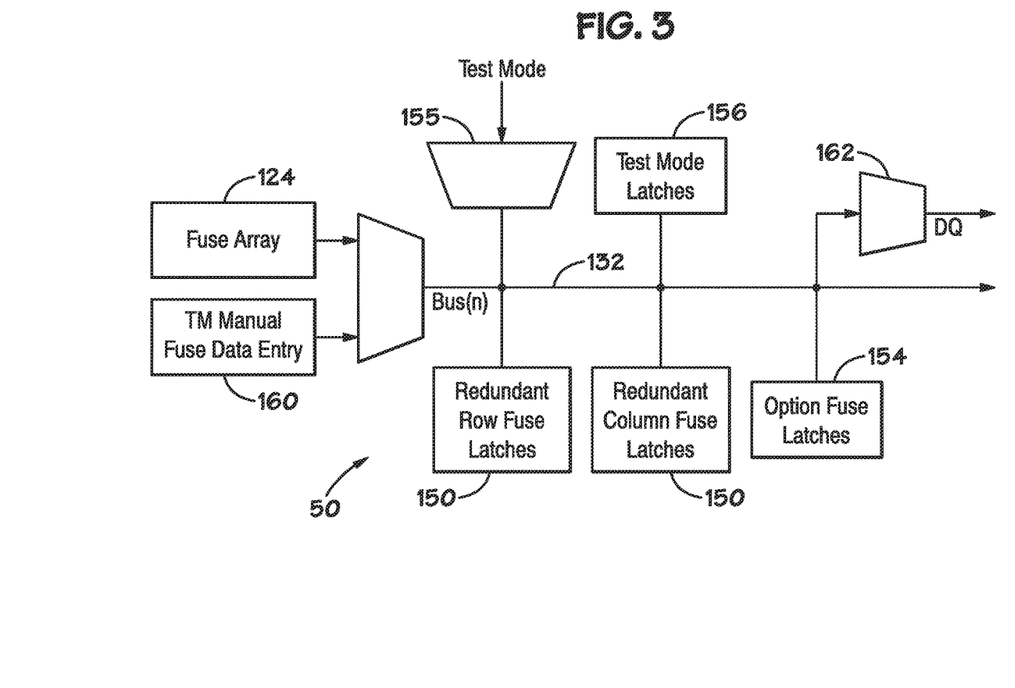
FIG. 3 is a block diagram depicting the fuse array broadcasting system of FIG. 1, including an N-bit bus system communicatively coupled to various systems of the memory device, in accordance with an embodiment.

FIG. 3 is a block diagram depicting an embodiment of the fuse array broadcasting system 50 having the N-bit bus system 132 communicatively coupled to latches 150, 152, 154, and 156. More specifically, latches 150 include redundant row fuse latches (e.g., latches which may be included in the latch circuitry 126) that may be suitable for providing row-level redundancy for addresses in the memory 102. Similarly, redundant column latches 152 (e.g., latches which may also be included in the latch circuitry 126) may be suitable for providing column-level redundancy for addresses in the memory 102. Option latches 154 may be used, for example, to trim certain circuitry in the memory device 10, such as voltage regulator circuitry trimming, as well as for analog level(s) trimming, timing changes, and so on. Testmode latches 156 may be used to test certain functionality of the memory device 10. For example, one or more testmode data 158 may be delivered through the N-bit bus system 132 for use by the testmode latches 156. Testmode latches 156 may test various behaviors, including fuse behaviors, of circuitry throughout the memory device 10. The testmode latches 156 may be loaded via the testmode circuitry 155.

It may be beneficial to transmit certain data to the fuse latches 150, 152, 154, and/or 156 without having to physically modify fuses in the fuse array 124. Accordingly, the techniques described herein provide for testmode manual fuse data entry 160. For example, rather than physically changing a fuse in the fuse array 124, certain fuse data representative of the fuse state, such as resistance, capacitance, and so on, may be transmitted via the testmode fuse data entry system 160. The data may then be received by the corresponding latch or latches and processed as mentioned above, to be stored in the latch or latches and then processed via compare circuitry (e.g., circuitry 126). That is, the operational behavior of latch circuitry, such as circuitry 126, may be observed after transmittal of test data via the testmode manual fuse data entry 160. Accordingly, the testmode fuse data entry 160 may enable the verification and/or validation of circuitry, such as the latch circuitry 126, without physically changing fuses in the fuse array 124. DQ pads 162 are also shown, suitable for communicating via the N-bit bus system 132. In certain embodiments, the DQ pads 162 may be included in the I/O interface 16, as mentioned earlier. Accordingly, communications, such as DQ pad 162 communications, may take place via the N-bit bus system 132 when the N-bit bus system 132 is not being used for fuse array 124 data and/or testmode manual fuse data entry 160. Accordingly, the N-bit bus system 132 may be used for communications of non-fuse data when fuse operations are not in progress, such as loading testmode latches 156 via the testmode circuitry 155.

Figure 4:
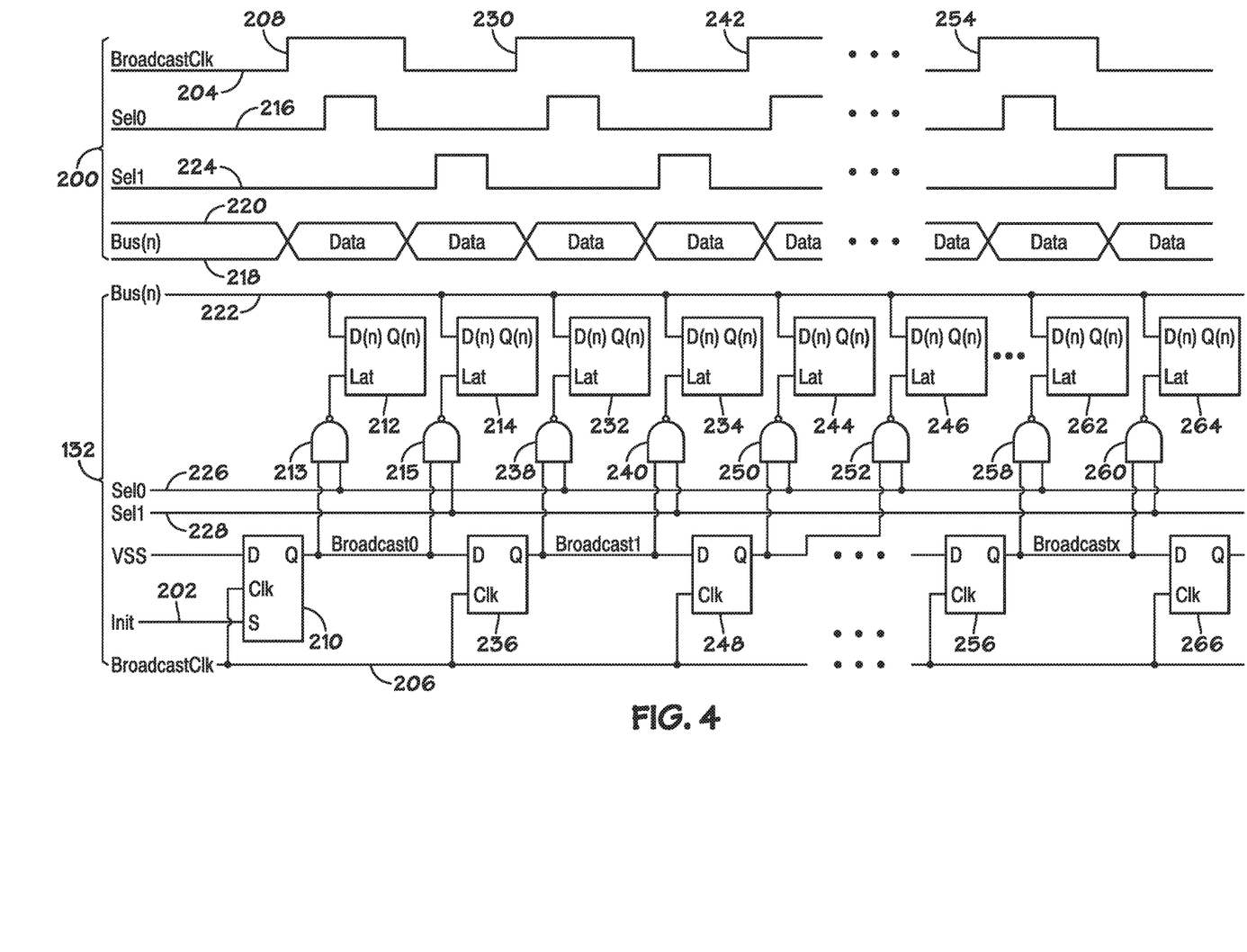
FIG. 4 is a diagram depicting certain waveforms used or communicated via an example of the N-bit bus system of FIG. 3, in accordance with an embodiment.

In certain embodiments, the N-bit bus system 132 may use token-based communications, for example, as illustrated in FIG. 4. More specifically, FIG. 4 is a diagram having a top portion 200 representative of certain waveforms used or communicated via an embodiment of the N-bit bus system 132 shown below portion 200. In the depicted embodiment, an initialization signal 202 may initialize communications for the N-bit bus system 132. A broadcast clock signal 204 may then be transmitted through a broadcast clock line 206 of the N-bit bus 132. For example, an autonomous state machine may issue the broadcast clock signal 204, corresponding to a token clock for embodiments that use the N-bit bus system 132 for token-based communications.

A rising edge 208 of the broadcast clock signal 204 designates (e.g., via D-type flip flop 210) a first two latches 212, 214 to receive data. More specifically, a clock select 0 signal 216, when high, denotes that data 218 and data 220 may now be readable by the latch 212 on N-bit lines 222 of the N-bit bus system 132. When a clock select 1 signal 224 goes high, then data 218, 220 may now be readable by latch 214 on the N-bit lines 222. The signals 216, 224 may be carried via lines 226, 228 of the N-bit bus system 132, respectively, and processed via NAND gates 213, 215. The use of the first select line 226 and the second select line 228 may enable doubling the data utilization for the N-bit bus 222. For example, the first select line 226 may set the N-bit bus 222 to a first state for data transmission (e.g., data 220), and the second select line 228 may set the N-bit bus 222 to a second state for data transmission (e.g., data 218), thus improving bus 222 utilization. It is also noted that 3, 4, 5, 6, or more select lines may be used to improve bus 222 utilization.

A second rising edge 230 may "move" the token to a second pair of latches 232, 234 to enable the latches 232, 234 to read data 218, 220 form the N-bit lines 222. More specifically, a D-type flip flop 236 coupled to NAND gates 238, 240 may designate latches 228, 230 to read data 218, 220 based on a high level of the clock select 0 signal 216 and of the clock select 1 signal 224, respectively. Similarly, a third rising edge 242 may move the token to a third pair of latches 244, 246 via a D-type flip flop 248 and NAND gates 250, 252. The latches 244, 246 may then be designated to read data 220, 218 when enabled via signals 216, 224. Any number M of latches may be similarly disposed to communicate via the N-bit bus system 132. For example, an Mth rising edge 254 may designate (via D-type flip flop 256 and NAND gates 258, 260), Mth latches 262, 264 to read data 220, 218 when enabled via signals 216, 224. A D-type flip flop 266 for use with M+1th latches is also shown. The latches depicted (e.g., 21, 214, 232, 234, 244, 246, 262, 264) may be redundant row fuse latches 150, redundant column fuse latches 152, option fuse latches 154, or testmode latches 156, and may be included in the latch circuitry 126. By using the broadcast clock signal 204 as a token clock signal, subsequent rises in the signal 204 may designate subsequent latches as "read" latches, thus providing for more efficient communications via the bus 222.

Figure 5:
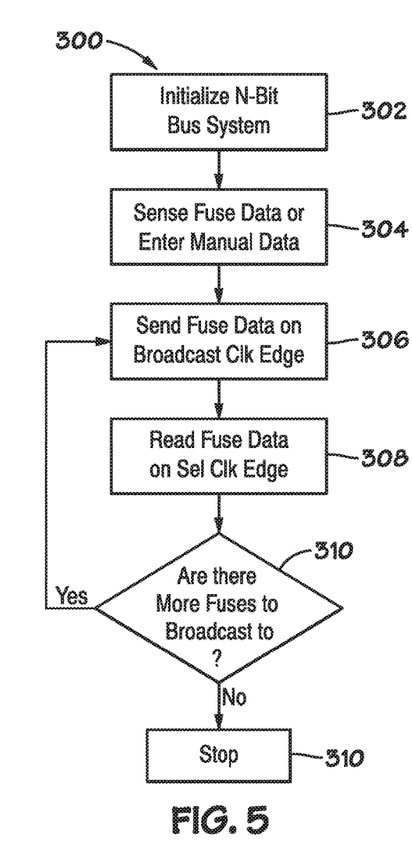
FIG. 5 is a flow chart of a process suitable for transmitting fuse data from the fuse array broadcasting system of FIG. 1 to one or more latches, in accordance with an embodiment.

FIG. 5 is a flow chart depicting an embodiment of a process 300 suitable for transmitting fuse data from the fuse array broadcasting system 50 to one or more latches, such as redundant row fuse latches 150, redundant column fuse latches 152, option fuse latches 154, and/or testmode latches 156, which may be included in the latch circuitry 126. The depicted embodiment may be implemented in a variety of circuitry, such as the fuse array broadcasting system 50 described above. In the illustrated embodiment, the process 300 may initialize (block 302) the N-bit bus system 132 to prepare the N-bit bus system for data transmission. For example, the initialization signal 202 may be transmitted to initialize the N-bit bus system 132. The process 300 may then sense (block 304) fuse data for one or all of the fuse array 124, or enable the entry of manual data via As mentioned above, fuse data may be sensed to include fuse properties such as resistance, capacitance, and so on. In some cases, instead of reading fuse data the fuse data may be entered manually, such as via the entry system 160.

The process 300 may then send (block 306) data, such as fuse array 124 data and/or manually entered data, option functionality data, and/or test data, by broadcasting the clock signal 204 on a high edge (e.g., edge 208) via the N-bit bus system 132 as described above. The first latches (e.g., latches 212, 214) may then read (block 308) the data (e.g., data 218, 220), for example, when the select clock signals 216, 224, go high. The data read may then be stored in the respective latches for subsequent use by the memory device 10. The process 300 may then determine (decision 310) if there are more fuses to broadcast data to. If there are more fuses to broadcast to, then the process 300 may iterate back to block 304 as shown. If there are no more fuses to broadcast to, then the process 300 may stop (block 312). If there are, for example, M latches, then the process 300 may execute block 304 and 306 M times, so that all of the M latches receive fuse data via the N-bit bus system 132.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A memory device, comprising:
a memory bank accessible via a plurality of memory addresses;
a fuse array comprising a plurality of fuses;
a first plurality of local fuse latches disposed outside of the fuse array and configured to provide redundancy for the plurality of memory addresses; and
a fuse array broadcasting system comprising an N-bit bus system, wherein the N-bit bus system is communicatively coupled to the fuse array and to the first plurality of local fuse latches, and wherein the fuse array broadcasting system is configured to communicate fuse data from the fuse array to the first plurality of local fuse latches via the N-bit bus system, wherein the fuse array broadcasting system comprises a testmode manual fuse data entry system configured to transmit test data representative of a state of the fuse array to the first plurality of local fuse latches via the N-bit bus system.

2. The memory device of claim 1, wherein the plurality of memory addresses comprises a plurality of row addresses and a plurality of column addresses, and wherein the first plurality of local fuse latches comprises a plurality of redundant row fuse latches configured to provide redundancy to the plurality of row addresses, and a plurality of redundant column fuse latches configured to provide redundancy to the plurality of column addresses.

3. The memory device of claim 1, comprising a second plurality of local fuse latches configured to provide for reconfiguration of at least one circuit option for the memory device, and wherein the fuse array broadcasting system is configured to communicate the fuse data from the fuse array or from a manual fuse data entry system to the second plurality of local fuse latches.

4. The memory device of claim 3, wherein the reconfiguration of the at least one circuit option comprises trimming a circuit included in the memory device.

5. The memory device of claim 1, comprising a second plurality of local fuse latches configured to provide for testmode operations for the memory device, and wherein the fuse array broadcasting system is configured to communicate the fuse data from the fuse array or from a manual fuse data entry system to the second plurality of local fuse latches.

6. The memory device of claim 1, wherein the N-bit bus system comprises a plurality of D-type flip flops coupled to a broadcast clock line and wherein the N-bit bus system is configured to use the plurality of D-type flip flops and a broadcast clock signal transmitted via the broadcast clock line to communicate the fuse data from the fuse array to the first plurality of local fuse latches via token-based communication.

7. The memory device of claim 1, wherein the N-bit bus system comprises a first and a second select line coupled to the plurality of latches, and wherein the N-bit bus system is configured to use the first and second select line to change a state of N-bit bus lines from a first state to a second state to double a data utilization of the N-bit bus lines.

8. The memory device of claim 1, comprising a double data rate type five (DDR5) memory device having the memory bank, the fuse array, first plurality of local fuse latches, and the fuse array broadcasting system.

9. A method, comprising:
deriving a fuse data for one or more fuses in a plurality of fuses disposed in a fuse array of a memory device;
transmitting the fuse data via a fuse array broadcasting system comprising an N-bit bus system to a first plurality of local fuse latches disposed outside of the fuse array;
storing the fuse data at the first plurality of local fuse latches; and
comparing the fuse data to determine if a redundant fuse included in the plurality of fuses should be activated by the memory device, wherein transmitting the fuse data comprises transmitting the fuse data via a token-based communication and wherein the broadcast clock signal is representative of a token clock signal.

10. The method of claim 9, wherein transmitting the fuse data comprises transmitting a broadcast clock signal to designate one of the first plurality of local fuse latches to read the fuse data from the N-bit bus system.

11. The method of claim 9, wherein transmitting the fuse data via the token-based communication comprises transmitting the token clock signal to a flip-flop circuitry configured to designate the one of the first plurality of local fuse latches.

12. The method of claim 9, comprising transmitting the fuse data via the fuse array broadcasting system to a second plurality of local fuse latches disposed outside of the fuse array, to a third plurality of local fuse latches disposed outside of the fuse array, or to a combination thereof, wherein the second plurality of local fuse latches are configured to provide for reconfiguration of at least one circuit option for the memory device, and wherein the third plurality of fuse latches are configured to provide for test operations of one more circuitry of the memory device.

13. The method of claim 9, comprising transmitting testmode manual fuse data via the fuse array broadcasting system to the first plurality of local fuse latches, to a second plurality of local fuse latches disposed outside of the fuse array, to a third plurality of local fuse latches disposed outside of the fuse array, or to a combination thereof, wherein the second plurality of local fuse latches are configured to provide for reconfiguration of at least one circuit option for the memory device, and wherein the third plurality of fuse latches are configured to provide for test operations of one more circuitry of the memory device.

14. A system, comprising:
a fuse array broadcasting system, comprising an N-bit bus system, wherein the N-bit bus system is communicatively coupled to the first plurality of local fuse latches, and wherein the fuse array broadcasting system is configured to communicate fuse data from a fuse array of a memory device to the first plurality of local fuse latches, and wherein the first plurality of local fuse latches are disposed outside of the fuse array, wherein the fuse array broadcasting system is configured to communicate the fuse data via a token-based communication and wherein the broadcast clock signal is representative of a token clock signal.

15. The system of claim 14, wherein the first plurality of local fuse latches are configured to provide for redundant memory address operations for the memory device.

16. The system of claim 14, wherein the N-bit bus system is communicatively coupled to a second plurality of local fuse latches disposed outside of the fuse array, to a third plurality of local fuse latches disposed outside of the fuse array, or to a combination thereof, wherein the fuse array broadcasting system is configured to communicate the fuse data from the fuse array to the second plurality of local fuse latches, to the third plurality of local fuse latches, or to the combination thereof, wherein the second plurality of local fuse latches are configured to provide for reconfiguration of at least one circuit option for the memory device, and wherein the third plurality of fuse latches are configured to provide for test operations of one more circuitry of the memory device.

17. The system of claim 14, wherein the fuse array broadcasting system is configured to communicate the fuse data by transmitting a broadcast clock signal to designate one of the first plurality of local fuse latches to read the fuse data from the N-bit bus system.

18. A memory device, comprising:
a memory bank accessible via a plurality of memory addresses;
a fuse array comprising a plurality of fuses;
a first plurality of local fuse latches disposed outside of the fuse array and configured to provide redundancy for the plurality of memory addresses; and
a fuse array broadcasting system comprising an N-bit bus system, wherein the N-bit bus system is communicatively coupled to the fuse array and to the first plurality of local fuse latches, and wherein the fuse array broadcasting system is configured to communicate fuse data from the fuse array to the first plurality of local fuse latches via the N-bit bus system, wherein the N-bit bus system comprises a plurality of D-type flip flops coupled to a broadcast clock line and wherein the N-bit bus system is configured to use the plurality of D-type flip flops and a broadcast clock signal transmitted via the broadcast clock line to communicate the fuse data from the fuse array to the first plurality of local fuse latches via token-based communication.

19. A method, comprising:
deriving a fuse data for one or more fuses in a plurality of fuses disposed in a fuse array of a memory device;
transmitting the fuse data via a fuse array broadcasting system comprising an N-bit bus system to a first plurality of local fuse latches disposed outside of the fuse array;
storing the fuse data at the first plurality of local fuse latches;
comparing the fuse data to determine if a redundant fuse included in the plurality of fuses should be activated by the memory device; and
transmitting testmode manual fuse data via the fuse array broadcasting system to the first plurality of local fuse latches, to a second plurality of local fuse latches disposed outside of the fuse array, to a third plurality of local fuse latches disposed outside of the fuse array, or to a combination thereof, wherein the second plurality of local fuse latches are configured to provide for reconfiguration of at least one circuit option for the memory device, and wherein the third plurality of fuse latches are configured to provide for test operations of one more circuitry of the memory device.

* * * * *